United States Patent [19]

Kimura et al.

[11] Patent Number: 4,970,564
[45] Date of Patent: Nov. 13, 1990

[54] SEMICONDUCTOR MEMORY DEVICE HAVING STACKED CAPACITOR CELLS

[75] Inventors: Shinichiro Kimura; Naotaka Hashimoto, both of Hachiouji; Yoshio Sakai, Tsukui; Tokuo Kure, Nishitama; Yoshifumi Kawamoto, Tsukui, all of Japan

[73] Assignee: Hitachi, Ltd., Tokyo, Japan

[21] Appl. No.: 287,881

[22] Filed: Dec. 21, 1988

[30] Foreign Application Priority Data

Jan. 8, 1988 [JP] Japan .................................. 63-1213

[51] Int. Cl.$^5$ ...................... H01L 29/78; H01L 27/02; H01L 29/04
[52] U.S. Cl. ..................................... 357/23.6; 357/41; 357/59
[58] Field of Search ...................... 357/23.6, 41, 59 G, 357/59 J

[56] References Cited

U.S. PATENT DOCUMENTS

| | | | |
|---|---|---|---|
| 4,151,607 | 4/1979 | Koyanagi et al. | 357/23.6 |
| 4,355,374 | 10/1982 | Sakai et al. | 357/23.6 |
| 4,475,118 | 10/1984 | Klein et al. | 357/23.6 |
| 4,649,406 | 3/1987 | Takemae et al. | 357/23.6 |
| 4,651,183 | 3/1987 | Lange et al. | 357/23.6 |
| 4,742,018 | 5/1988 | Kimura et al. | 357/23.6 |
| 4,754,313 | 6/1988 | Takemae et al. | 357/23.6 |
| 4,794,563 | 12/1988 | Maeda | 357/23.6 |
| 4,905,064 | 2/1990 | Yabu et al. | 357/23.6 |

Primary Examiner—Gene M. Munson
Attorney, Agent, or Firm—Fay, Sharpe, Beall, Fagan, Minnich & McKee

[57] ABSTRACT

A semiconductor memory device having STC cells wherein major portions of active regions consisting of channel-forming portions are tilted at an angle of 45° with respect to the word lines and the bit lines that meet at right angles with each other, enabling the storage capacity portions to be arranged very densely and sufficiently large capacities to be maintained with very small cell areas. In the semiconductor memory device, furthermore, the storage capacity portions are formed even on the bit lines. Therefore, the bit lines are shielded, the capacitance between the bit lines decreases, and the memory array noise decreases.

26 Claims, 9 Drawing Sheets

SEMICONDUCTOR MEMORY DEVICE HAVING STACKED CAPACITOR CELLS

BACKGROUND OF THE INVENTION

The present invention relates to a semiconductor memory device which is very small in size and has a large storage capacity, and more specifically to stacked capacitor (STC) cells of a dynamic random access memory (DRAM) that is adapted to being integrated highly densely.

The integration degree of a DRAM has quadrupled in every three years, and mega-bit memories have already been mass-produced. The degree of integration is heightened by decreasing the sizes of elements. However, reduction in the storage capacity accompanying the decrease in sizes has invited problems with regard to decrease in the signal-to-noise (S/N) ratio, inversion of signals caused by incident alpha particles and maintenance of reliability.

As a memory cell capable of increasing the storage capacity, therefore, a stacked capacitor cell in which part of a storage capacity portion is overlapped on a switching transistor or on an element isolating oxide film disclosed in Japanese Patent Publication No. 55258/ 1986 has been expected to substitute for the existing planar type capacitor.

FIG. 2 is a layout plan view of a conventional STC cell, where reference numeral (2.1) denotes active regions where a channel region and an impurity diffusion layer will be formed to constitute a switching transistor, (2.2) denotes word lines that serve as gate electrodes for the switching transistor, (2.3) denotes contact holes through which the bit lines (2.8) come into contact with the diffusion layer in the substrate, (2.4) denote conductive layers that serve as pads for connecting the bit lines and the diffusion layer together, (2.5) denote contact holes for connecting the lower electrodes (2.6) of storage capacities to the diffusion layer, (2.7) denotes plane electrodes, and (2.8) denotes bit lines.

With the STC cell, the storage capacity portion indicated by the storage capacity lower electrode (2.6) can be extended onto the word line, making it possible to realize a storage capacity which is considerably greater than that of a planar type cell in which only the surface of the substrate is utilized as a storage capacity portion. Therefore, even a small cell area employed for the mega-bit DRAM's is capable of producing a storage capacity which is large enough for operating the circuit. With the conventional planar type cell having the same cell area as the above-mentioned cell, however, it is difficult to obtain a required capacity even if thickness of the insulating film is reduced.

In fact, however, even the STC cell has many problems as will be described below in detail in conjunction with a section view of FIG. 4. The STC cell is fabricated through the below-mentioned steps. First, on a single crystalline semiconductor substrate (4.1) is grown a relatively thick oxide film; (4.2) for electrically isolating the individual elements by the widely known thermal oxidation method. The film thickness ranges from about 100 to about 1000 nm. Then, a gate insulating film (4.3) for forming a switching transistor is grown by the widely known thermal oxidation method. The film thickness decreases with the reduction in the size of element and, usually, ranges from 10 to 50 nm. Polycrystalline silicon containing impurities is deposited and is delineated by the widely known photolithograph method and the dry etching method to form a word line (4.4). Using the delineated word line as a mark, furthermore, impurities having a conductivity type different from that of the substrate (4.1) are introduced by the widely known ion implantation method thereby to form an impurity diffusion layer (4.5). It needs not be pointed out that the heat treatment is necessary for activating the impurity diffusion layer. Then, in order to form a storage capacity portion, polycrystalline silicon (4.7) having the same type of conductivity is deposited by the widely known CVD (chemical vapor deposition) method so as to come into contact with the impurity diffusion layer in the substrate. As will be obvious from the plan view of FIG. 2, the polycrystalline silicon (4.7) is formed also on the word line (4.4) and on the element isolating film (4.2). Therefore, the area of the storage capacity portion increases and, hence, a large storage capacity is maintained.

At this moment, furthermore, polycrystalline silicon is also formed simultaneously even on a place where the contact hole (2.3 in FIG. 2) is formed to connect the bit line (4.11) to the impurity diffusion layer (4.5). Even when the distance among the word lines is small, therefore, the bit line can be connected to the diffusion layer via the polycrystalline silicon layer (2.4 in FIG. 2) without causing the bit line (4.11) and the word line (4.4) to be short-circuited to each other. Here, reference numerals (4.6) and (4.10) denote interlayer insulating films.

In the STC cell of the conventional structure, however pad conductor layer (2.4) must be exposed when a plate electrode (4.9) is to be formed. This is because, the bit line (4.11) and the pad conductor layer must come into contact with each other through this place. In delineating the plate electrode, therefore, a highly sophisticated technology is required to stop the pad conductor layer from being etched accompanying the dry etching of the plate electrode using a very thin capacitor insulating film (4.8) that is formed also on the surface of the pad conductor layer, such that the pad conductor layer will not be ground.

In addition to the above-mentioned problem involved in the production, there exists another essential problem in that it is difficult to decrease the cell area so far as the above-mentioned cell structure is employed. This stems from the fact that a sufficiently large distance must be maintained between the plate electrode (4.9) and the pad conductor layer (2.4) so that the two will not come into contact with each other. It is allowable to omit the pad conductor layer (2.4). In this case, however, the distance among the word lines must be increased to prevent the short-circuiting between the bit lines (4.11) and the word lines (4.4), making it difficult to decrease the cell areas.

With the conventional STC structure as described above, it is difficult to decrease the cell area. Namely, the conventional STC cells are not applicable for very highly integrated DRAM's of 4-mega-bits or greater.

An STC structure free from these problems has been taught in Japanese Utility Model Laid-Open No. 178894/1980. FIG. 3 is a layout plan view of this STC cells. To simplify the drawing, there are shown no lower electrode of storage capacity or plate electrode that are arranged on the contact hole (3.4) in the memory portion.

The feature of this structure resides in that in the active region (3.1), the bit line (3.5) is not arranged on a portion where a contact hole (3.4) of the memory portion is opened. It needs not be pointed out that the bit line (3.5) is in contact with the impurity diffusion layer of the substrate through the contact hole (3.3). The storage capacity portion is formed after the bit lines have been formed. In forming the plate electrodes, therefore, there is no need of exposing the bit line contact portions that are shown in FIGS. 2 and 4. Reference numerals 3.2 denote lead wires.

That is, the plate electrodes need simply cover the memory cell portions.

According to such a cell structure in which the area of the lower electrode of storage capacity is not limited by the delineation of plate electrode, a large storage capacity can be realized yet decreasing the cell area.

Even with this structure, however, great difficulty is involved to shorten the distance among the bit lines if bit lines (3.5) arranged in parallel are not simply overlapped on the contact holes (3.4) of memory portion in the active region (3.1). In the layout of FIG. 3, the distance increases among the bit lines imposing limitation on reducing the cell area. Summary of the Invention In view of the problems involved in the aforementioned prior art, the object of the present invention is to provide a semiconductor memory device which is small in size and which has a large storage capacity. In particular, the object of the present invention is to provide a semiconductor memory device having fine STC structure that can be used for a highly densely integrated DRAM's of 1-mega-bits or greater.

The semiconductor device referred to in the present invention consists of a switching transistor and a charge storage capacitor as a minimal unit.

FIG. 1 is a plan view illustrating the layout of memory cells according to the present invention. In the present invention, the main portions of active regions (1.1) are in parallel with neither the word lines (1.2) nor the bit lines (1.4) that are at right angles with each other. In order to arrange the active regions most densely according to the present invention, the main portions of active regions are arranged at an angle of 45 degrees with respect to the word lines and the bit lines, and only the portions where the contact holes (1.5) of memory portion are opened are arranged in parallel with the bit lines. Furthermore, the four active regions closest to one active region have extensions of their major portions that meet at right angles with one another. A memory array is constituted by arranging the unit plan layout diagram of FIG. 1 repetitively in the vertical and horizontal directions. Therefore, the peripheral portions of FIG. 1 have been partly omitted.

In FIG. 1, reference numeral 1.3 denotes contact holes for bit lines, 1.6 denotes lower electrodes of storage capacities, and 1.7 denotes plate electrodes.

In this specification, furthermore, the active region stands for all regions of the substrate surrounded by an element isolating insulating film (i.e., a substrate region that is not covered with the element isolating insulating film). Substantially, the active region stands for a region that consists of "a region of impurity diffusion layer in contact with the bit lines", "a region of impurity diffusion layer in contact with the lower electrodes of storage capacities" and "a channel forming portion under the word lines". Further, the main portions of active regions stand for those portions where the channels of switching transistors are formed.

FIG. 5 is a section view illustrating the STC structure according to the present invention. In the present invention, the active regions are aslantly arranged relative to the word lines and bit lines. Therefore, the section view of FIG. 5 is along the line that connects the centers of a pair of contact holes (1.5) of memory portion.

According to the present invention, the active regions simply run in a tilted direction and are formed in a manner that is little different from the conventional forming method.

With the memory cell of the present invention shown in FIG. 1, the word lines (1.2 are tilted with respect to the active regions (1.1) but have their gate lengths determined by the shortest distance between the impurity diffusion layer in contact with the bit lines and the impurity diffusion layer in contact with the lower electrodes of storage capacities.

The word lines (5.4) are insulated by an interlayer insulating film (5.6) from other conductor layers in a self-aligned manner. In this section view, the source and drain have simple structure of impurity diffusion layer. It is, however, also allowable to employ widely known diffusion layers for source and drain with graded impurity profile.

After the word lines are formed, ions are implanted using word lines as a mask in order to form impurity diffusion layers (5.5).

Next, bit lines (5.7) are formed. Like the word lines (5.4), the bit lines (5.7) are insulated using an insulating film (5.8) in a self-aligned manner. In the section view of FIG. 5, bit lines (5.7) exist having the same shape as the pad conductor layers (2.4) of FIG. 4.

With a lattice being constituted by the word lines and bit lines as described above, the surfaces are represented by a pair of diffusion layers in which the active regions (1.1) have been formed already in the valleys among the word lines and bit lines as is clear from the layout plan view of FIG. 1. Lower electrodes (1.6 and 5.9) of storage capacities are formed thereon. The lower electrodes are then delineated to form a capacitor insulating film (5.10), and a plate electrode (5.11) is formed thereon. The plate electrode (5.11) needs not be delineated on the memory array unlike the case of STC cells shown in FIGS. 2 and 4. Reference numeral (5.12) denotes an interlayer insulating film on the plate electrode (5.11) on which aluminum wirings (not shown) will be formed.

In FIG. 5, reference numeral 5.1 denotes a semiconductor substrate, 5.2 denotes an element isolating insulating film, 5.3 denotes a gate insulating film, and 5.8 denotes an interlayer insulating film.

The element isolating film (5.2) is formed on the surface of the single crystalline semiconductor substrate (5.1) other than the active regions.

The lower electrode (5.9) of storage capacity is composed of a refractory metal such as tungsten or polycrystalline silicon and has a thickness of usually from 100 to 500 nm by taking the steps in thickness into consideration. However, the thickness needs not be limited thereto only; e.g., the lower electrode (5.9) may have a large thickness as far as there does not develop any problem in regard to the steps in thicknesses.

Examples of the material of the capacitor insulating film (5.10) include silicon oxide film, silicon nitride film, a composite film consisting of silicon oxide film and silicon nitride film, and refractory metal oxide films such as $Ta_2O_5$, as well as a composite film of refractory metal oxide film and silicon oxide film and a composite film of refractory metal oxide film and silicon nitride film. The capacitor insulating film may have a thickness nearly equal to that of the conventional STC cells.

The material of the plate electrode (5.11) may be polycrystalline silicon or a refractory metal such as tungsten. The film thickness thereof may be nearly the same as that of the conventional STC cells.

The width and pitch of the word lines (5.4) and bit lines (5.7) are determined by the cell area. In the case of 16 mega-bits, for instance, the word lines have a width of 0.5 to 0.7 μm and a pitch of 1 to 1.4 μm, and the bit lines have a width of 0.6 to 0.9 μm and a pitch of 1.2 to 1.8 μm.

With the shape and arrangement of active regions being selected as described above, there exists no constraint on layout among the bit lines (3.5) that took place in the case of the traditional structure, and the pitch among the bit lines can be greatly decreased. That is, in the conventional structure, the bit lines (3.5) pass through one side only of the contact holes (3.4) of memory portion. According to the present invention, on the other hand, the contact hole (1.5) of memory portion is sandwiched between the two bit lines (1.4).

As described earlier, furthermore, both the word lines (1.2) and the bit lines (1.4) are insulated from other conductor layers in a self-aligned manner, making it possible to shorten the pitch among the word lines as well as to open, in a self-aligned manner, the contact holes (1.5) of memory portion through which the storage capacity portions, i.e., lower electrodes (1.6 and 5.9) of storage capacities come into contact with the substrate.

By adapting the above-mentioned structure, a memory cell having a very small area can be constituted as shown in FIG. 1 to realize a very highly integrated DRAM's of greater than 4 mega-bits.

In addition, unlike the conventional STC structure shown in FIG. 2, the lower electrodes (1.6 and 5.9) of storage capacities are not limited for their areas by the delineation of the plate electrodes (1.7 and 5.11) formed thereon, and can be uniformly arranged maintaining a minimum delineating space, With the STC structure of the present invention, furthermore, the bit lines are completely covered by the plate electrodes having a fixed potential and by the conductor layers of storage capacity portions. Therefore, the interline capacitance among the bit lines decreases greatly, and memory array noise decreases, i.e., coupling noise stemming from the interline capacitance decreases compared with that of the conventional structure.

Description of the Preferred Embodiments

EMBODIMENT 1.

A first embodiment of the present invention will now be described in conjunction with FIGS. 6a to 6i.

Figure 6A:
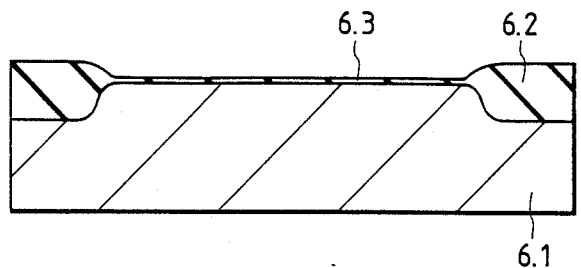
FIGS. 6a to 6i are section views illustrating the steps for fabricating memory cells according to a first embodiment of the present invention.
Figure 6B:
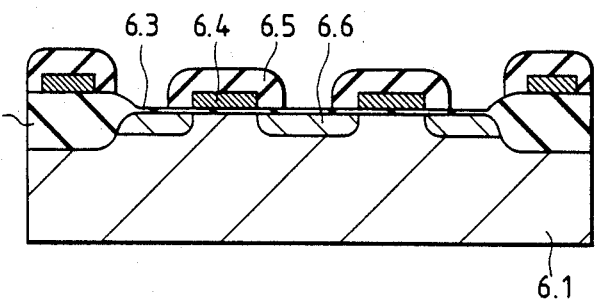

As shown in FIG. 6a, first, an element isolating film (6.2) for electrically isolating the individual elements and a gate insulating film (6.3) are grown on a single crystalline semiconductor substrate (6.1) of a first type of conductivity by the widely known thermal oxidation method. The element isolating film is grown over a range of 200 to 1000 nm and the gate insulating film is grown over a range of 10 to 20 nm. In the DRAM's of a mega-bit level, a known improved LOCOS method is employed to suppress the so-called extension of bird's beak, since the widths of active regions and widths of element isolating regions become of the order of submicrons. Word lines (6.4) are formed on the surface as shown in FIG. 6b. Though this embodiment employs polycrystalline silicon containing impurities as a material for forming word lines, it is also allowable to use a polysilicide which is a laminated film consisting of low-resistance polycrystaline silicon and silicide, or a refractory metal represented by tungsten. The word lines have a width of 0.5 to 0.7 μm, a film thickness of 200 nm, and a pitch of 1 to 1.4 μm.

The word lines are covered with an interlayer insulating film (6.5) in a self-aligned manner. That is, in delineating polycrystalline silicon that forms word lines, the insulating film deposited thereon is used as a mask to effect the delineation, and the side walls that are exposed are covered with the side wall insulating films that are left when the insulating film that is further deposited thereon is subjected to the anisotropic dry etching.

Using the word lines as a mask, impurities having a conductivity type different from that of the substrate are ion-implanted in order to form impurity diffusion layers (6.6). The impurities are activated by the heat treatment at 800° to 1000°C. Though the section view of FIG. 6b shows a conventional single drain structure, it is allowable to use a widely known drain with a graded impurity profile.

The impurity diffusion layers (6.6) are isolated from each other by the element isolating oxide film (6.2) formed in a preceding step for each of the elements.

In this embodiment, the impurity diffusion layers are formed relying upon the ion implantation method. It was, however, also attempted to diffuse impurities from the bit lines (6.8) or from the lower electrodes (6.11) of storage capacities as described later. According to this method, no defect develop at all unlike the case of the ion implantation method, and a junction is realized with little leakage current enabling the memory retentivity of memory device to be improved.

Figure 1:
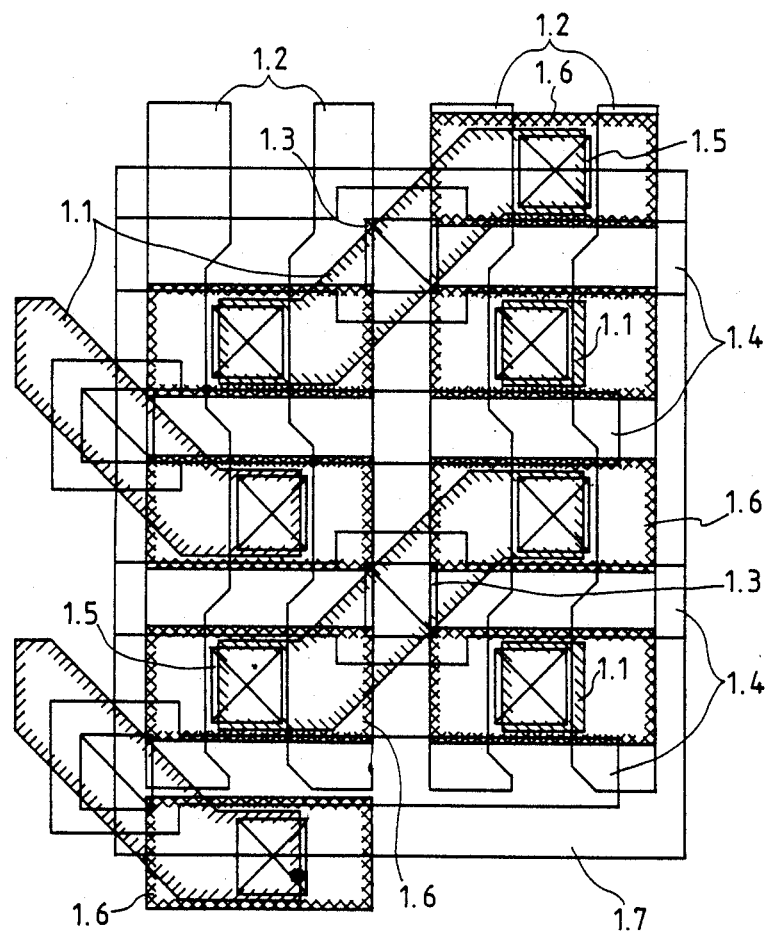
FIG. 1 is a plan view for explaining the memory cells in a semiconductor memory device of the present invention.
Figure 2:
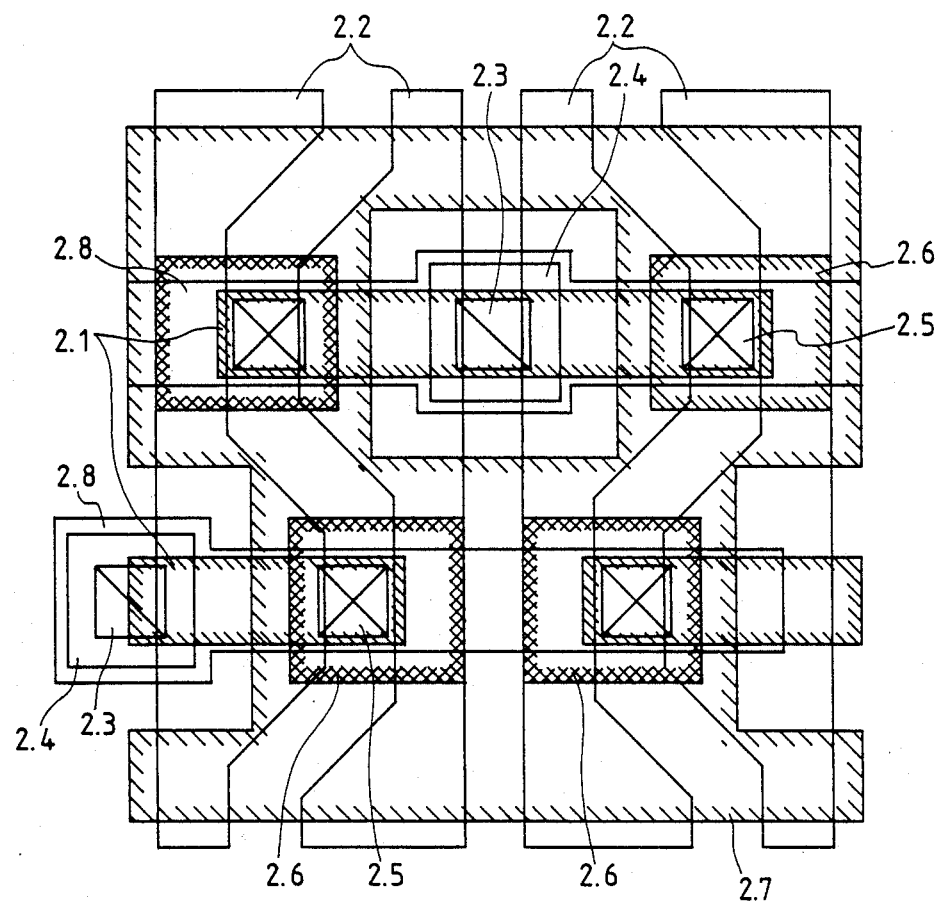
FIG. 2 is a plan view for explaining conventional STC cells.
Figure 3:
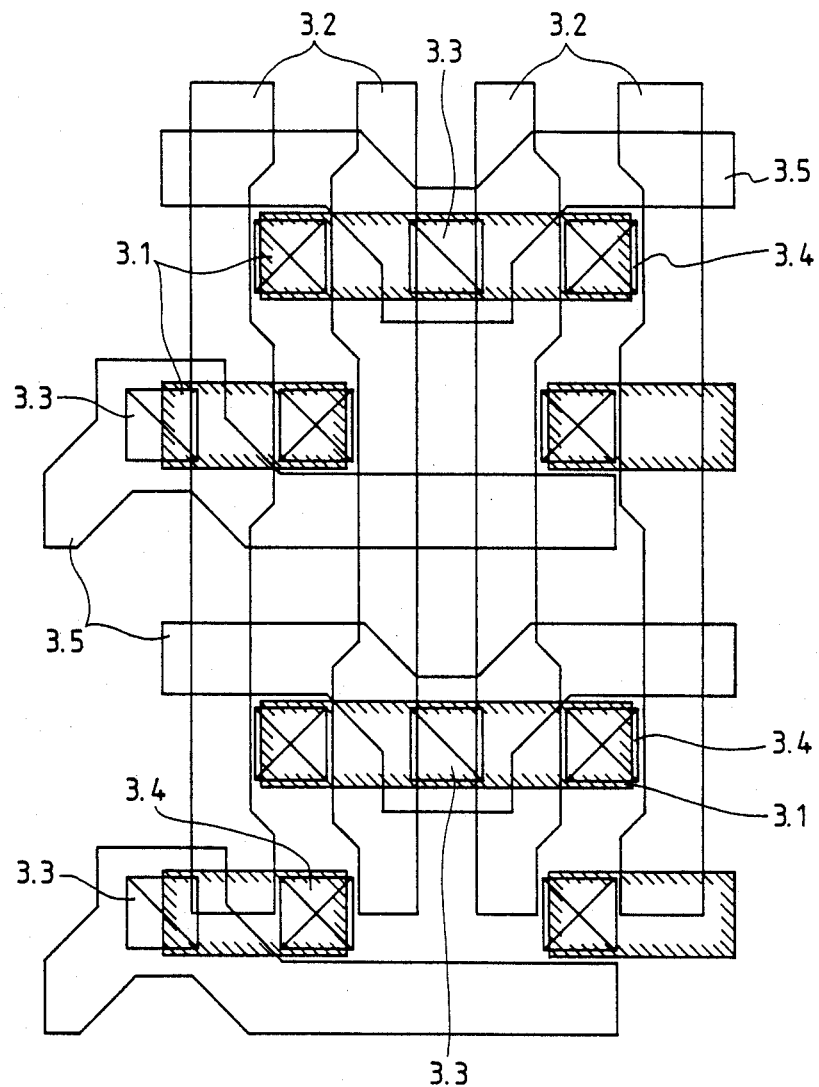
FIG. 3 is a plan view for explaining STC cells according to another conventional art.
Figure 4:
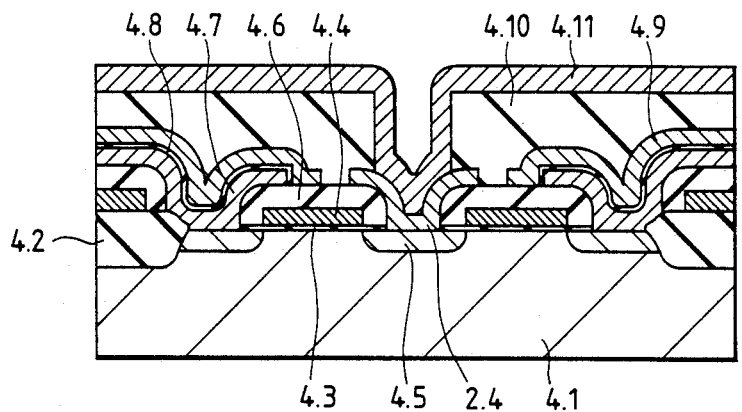
FIG. 4 is a section view of STC cells shown in FIG. 2.
Figure 5:
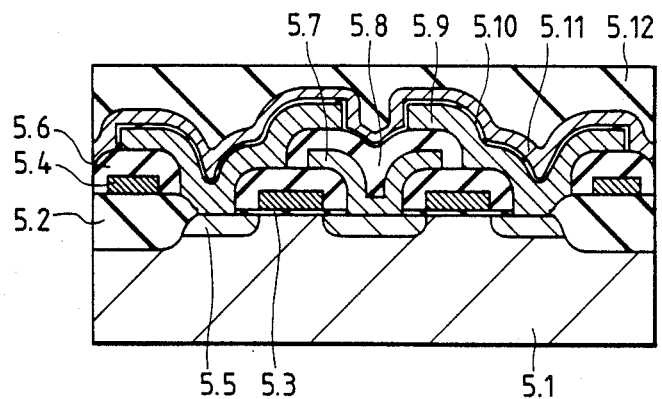
FIG. 5 is a section view of STC cells shown in FIG. 1.
Figure 6C:
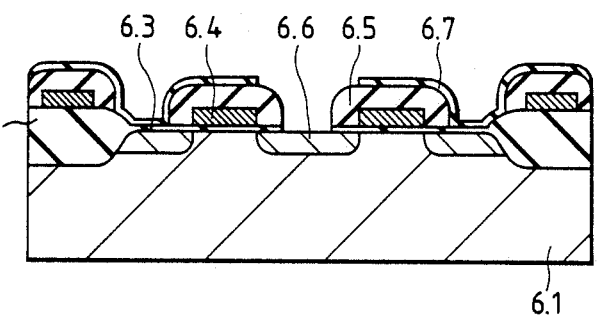

Next, referring to FIG. 6c, an insulating film (6.7) is deposited on the whole surface by the conventional CVD method, and only those portions where the bit lines come into contact with the diffusion layers in the substrate are opened (contact holes (1.3) for bit lines in FIG. 1) by the widely known photolithograph method and dry etching method. The insulating film (6.7) serves as an underlying layer when the bit lines are to be delineated in the next step, and prevents the surface of the substrate from being exposed and further prevents the element isolating film (6.2) from being ground. The film thickness is determined by the etching selecting ratio relative to the underlying layer when the bit lines are to be delineated. In this embodiment, however, the film thickness ranges from 20 to 100 nm.

Figure 6D:
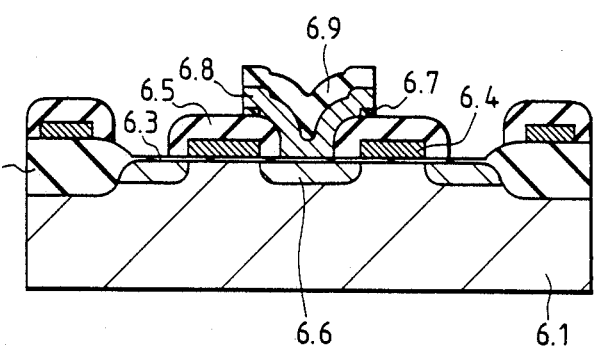
Figure 6E:
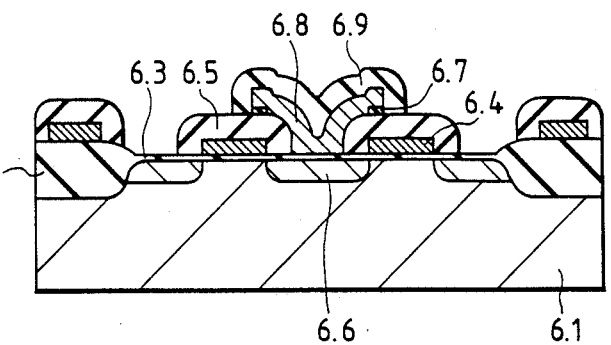

Referring to FIG. 6d, bit lines (6.8) are formed. The bit lines are delineated together with the insulating film (6.9). The bit lines have a width of 0.6 to 0.9 μm, a thickness of 250 nm and a pitch of 1.2 to 1.8 μm. In this embodiment, the storage capacity portions are formed by the heat treatment at high temperature after the bit lines have been formed. For this purpose, therefore, the bit lines are composed of a material that can withstand the heat treatment. Furthermore, a small resistance is also an essential requirement. In this embodiment, therefore, use is made of a polysilicide or tungsten, or a laminated film of a refractory metal nitride and a refractory metal. An insulating film is further deposited thereon, and side walls of bit lines that are exposed in FIG. 6d are covered relying upon the widely known dry etching method (FIG. 6e).

Figure 6F:
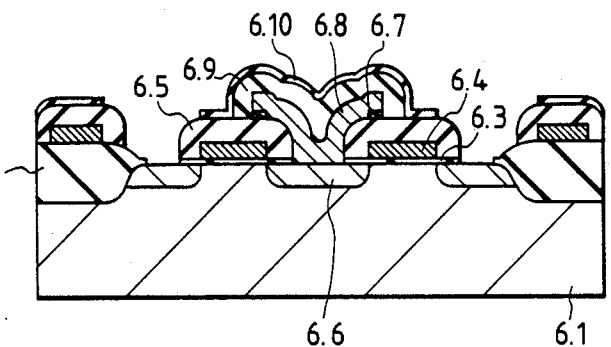

In this stage, the region where the contact hole (1.5) of memory portion of FIG. 1 is opened, is surrounded by the word lines and bit lines that are insulated from each other. By removing the thin oxide film on the active region, the diffusion layer in contact with the storage capacity portion can be exposed. In this embodiment as shown in FIG. 6f, an insulating film (6.10) is deposited maintaining a thickness of about 10 to 100 nm so as to serve as an underlying layer for delineating the storage capacity portions, and the regions of the diffusion layers only are exposed. Thus, by insulating the word lines and the bit lines from each other in a self-aligned manner, the contact region of memory portion is also formed in a self-aligned manner being surrounded thereby making a feature of the present invention.

Figure 6G:
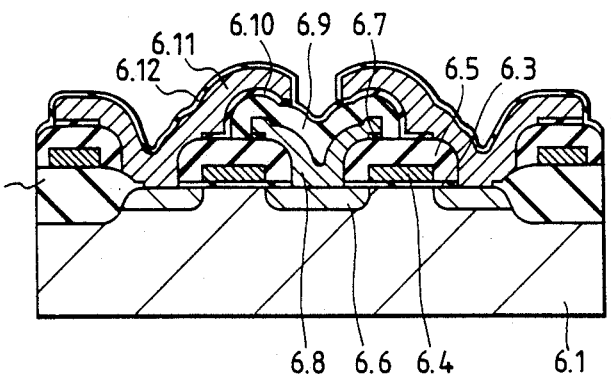

Referring to FIG. 6g, there is formed the lower electrode (6.11) having a thickness of 300 to 350 nm of the storage capacity with the same conductivity type as that of the impurity diffusion layer, and a capacitor insulating film (6.12) is formed on the surface thereof maintaining a thickness of 3 to 10 nm. In this embodiment, though polycrystalline silicon containing impurities is used as the lower electrode, it is also allowable to use a refractory metal such as tungsten. As the capacitor insulating film, furthermore, there can be used a thermally oxidized film grown on the surface of polycrystalline silicon, a laminated film of an oxide film and a nitride film, a composed film of silicon oxide and silicon nitride, or an insulating film with a high dielectric constant such as $Ta_2O_5$ or a multi-layer film using an insulating film with a high dielectric constant.

Figure 6H:
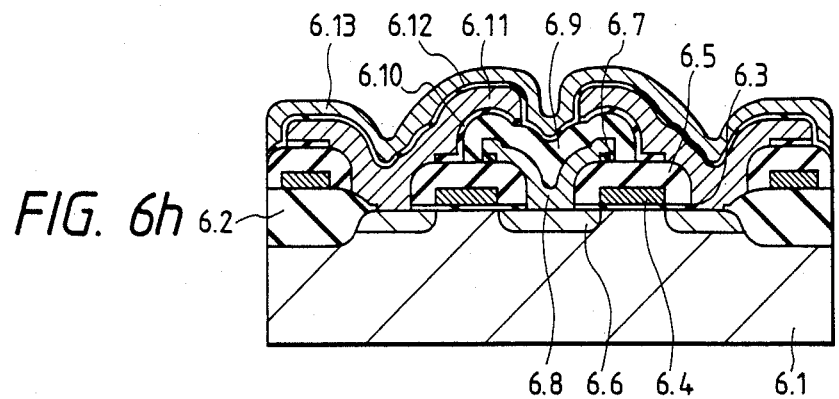

Referring to FIG. 6h, a plate electrode (6.13) is deposited maintaining a thickness of 100 to 150 nm to complete the storage capacity portion of a memory cell. The plate electrode needs not be delineated on the memory cell making another feature of the present invention. The plate material consists of polycrystalline silicon containing impurities or a refractory metal such as tungsten.

Figure 6I:
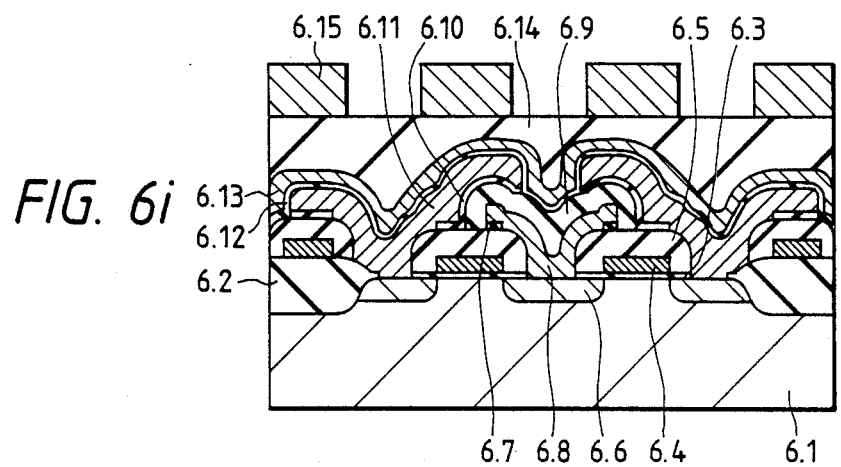

In FIGS. 6g to 6i, a portion of the insulating film (6.10) just on the bit line is missing and, instead, the capacitor insulating film (6.12) is shown as a unitary structure, in order to emphasize the fact that the insulating film (6.10) is ground to some extent when it serves as the underlying layer for delineating the lower electrode (6.11) of the storage capacity. In many cases, however, the insulating film (6.10) is left on this portion but having a reduced thickness.

Finally, an interlayer insulating film (6.14) is formed as shown in FIG. 6a, and an aluminum wiring (6.15) is formed thereon to complete the memory cell.

According to this embodiment, the interlayer insulating film 6.5), insulating film (6.7), insulating film (6.9). insulating film (6.10) and interlayer insulating film (6.14) are all comprised of $SiO_2$ films. Further, the interlayer insulating film (6.5), insulating film (6.9) and interlayer insulating film (6.14) have thicknesses of 250 nm, 250 nm and 350 nm, respectively.

EMBODIMENT 2.

Figure 7:
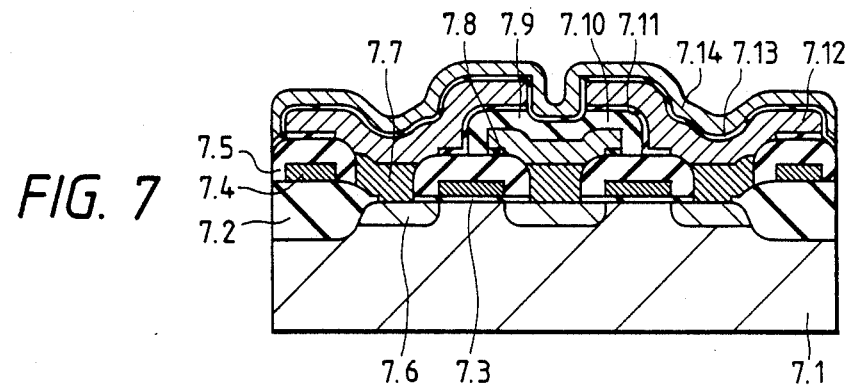
FIG. 7 is a section view of memory cells according to a second embodiment of the present invention.

FIG. 7 illustrates a second embodiment of the present invention. The feature of this embodiment resides in that a conductor layer (7.7) composed of polycrystalline silicon having the same conductivity type as the impurity diffusion layer is selectively grown only on the impurity diffusion layer formed in the active region. The conductor layer (7.7) has a thickness of 200 to 300 nm. As described earlier, one of the features of the present invention resides in that the word lines and the bit lines are insulated from each other in a self-aligned manner. Therefore, substantial sizes of the contact hole (1.3) and contact hole (1.5) of memory portion of FIG. 1 are determined by the thicknesses of the side wall insulating films; i.e., the contact holes are opened by the self-aligned process in a broad sense. In the case of the contact hole of the memory portion having an increased depth, however, the side wall insulating film may be ground at the time of delineating the bit lines and the underlying word lines may be exposed. In opening the contact holes of memory portion, furthermore, the oxide film covering the side walls of word lines and bit lines may be ground such that the word lines and bit lines are exposed and develop short-circuiting with the storage capacity portion.

According to this embodiment, therefore, the region of diffusion layer is elevated to prevent the occurrence of the above-mentioned danger and to facilitate the delineation for opening the contact holes.

After the delineation of word lines (6.4) shown in FIG. 6b is finished, the gate insulating film (6.3) is removed and the conductor layer (7.7) is grown thereon. In this embodiment, the polycrystalline silicon is grown relying upon the widely known CVD method.

Reference numeral (7.1) denotes a single crystalline semiconductor substrate, (7.2) denotes an element isolating film, (7.3) denotes a gate insulating film, (7.4) denotes word lines, reference numerals (7.5), (7.8), (7.10) and (7.11) denote interlayer insulating films, (7.6) denotes impurity diffusion layers, (7.7) denotes selectively grown portions, (7.9) denotes bit lines, (7.12) denotes a lower electrode of storage capacity, (7.13) denotes a capacitor insulating film, and (7.14) denotes a plate electrode.

EMBODIMENT 3.

Figure 8A:
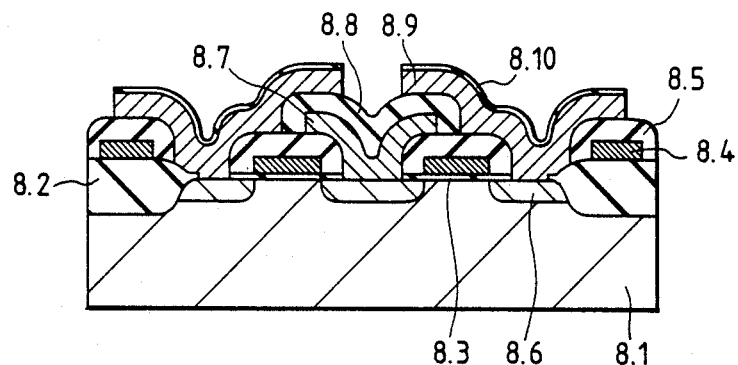
FIGS. 8a and 8b are section views illustrating the steps for fabricating memory cells according to a third embodiment of the present invention.
Figure 8B:
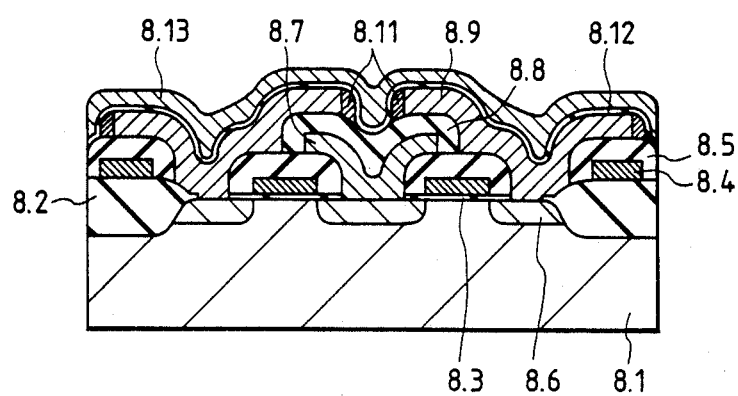

FIGS. 8a and 8b are section views illustrating the fabrication steps according to a third embodiment of the present invention. In this embodiment, the storage capacity portion is arranged on the uppermost portion of the memory cell, and there is no need of delineating the plate electrode on the memory cell. Therefore, the delineation of the plate electrode is not affected by the shape of the storage capacity portion. In this embodiment, this feature is utilized to increase the storage capacity portion. As shown in FIG. 8a, therefore, the insulation film (8.10) is formed on the surface of the lower electrode (8.9) of the storage capacity, and is delineated together therewith. Next, a conductor layer is deposited again on the surface thereof followed by anisotropic dry etching, so that the conductor layers deposited on the side walls are left as side wall portions (8.11) as shown in FIG. 8b. The capacity can be increased by the amounts of the side wall portions. This embodiment makes it possible to increase the capacity by 20 to 30% compared with that of the structure of FIG. 1.

The lower electrodes (8.9) of storage capacities have been so delineated that the distance between the side walls thereof becomes as small as possible. When the side wall portions (8.11) are not provided, therefore, it is not allowed to decrease the distance between the side walls to be as small as that of this embodiment.

Here, reference numeral (8.1) denotes a single crystalline semiconductor substrate, (8.2) denotes an element isolating film, (8.3) denotes a gate insulating film (8.4) denotes word lines, reference numerals (8.5) and (8.8) denote interlayer insulating films, (8.6) denote impurity diffusion layers, (8.7) denote bit lines, (8.9) denotes lower electrodes of storage capacities, (8.10) denotes an insulating film, (8.11) denotes side wall portions of lower electrodes, (8.12) denotes a capacitor insulating film, and (8.13) denotes a plate electrode.

EMBODIMENT 4.

Figure 9:
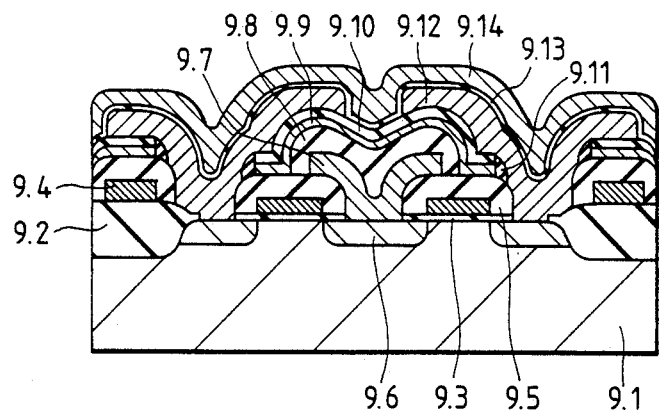
FIG. 9 is a section view of memory cells according to a fourth embodiment of the present invention.

FIG. 9 illustrates a fourth embodiment of the present invention. In order to decrease the interline capacity between the bit lines (9.7) and other conductor layer according to this embodiment, the whole body is covered with a conductor layer (9.9) after the bit lines (9.7) have been formed, and the conductor layer is fixed to a given potential. Like when the word lines and bit lines are formed, the conductor layers (9.9) are formed being insulated in a self-aligned manner at the time of opening the contact holes of memory portion. Therefore, the intermediate conductor layer can be formed without requiring any additional mask.

Here, reference numeral (9.1) denotes a single crystalline semiconductor substrate, (9 2) denotes an element isolating film, (9.3) denotes a gate oxide film, (9.4) denotes a gate electrode, reference numerals (9.5), (9.8), (9.10) and (9.11) denote interlayer insulating films, (9.6) denote impurity diffusion layers, (9.7) denote bit lines, (9.9) denotes an intermediate conductor layer, (9.12) denotes lower electrodes of storage capacities, (9.13) denotes a capacitor insulating film, and (9.14) denotes a plate electrode.

EMBODIMENT 5.

Figure 10:
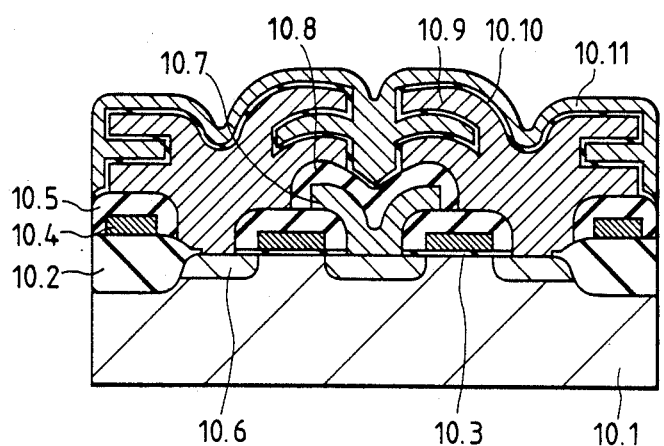
FIG. 10 is a section view of memory cells according to a fifth embodiment of the present invention.

FIG. 10 illustrates a fifth embodiment of the present invention in which dents are formed in the side surfaces of lower electrodes (10.9) of the storage capacities in order to further increase the storage capacity. To form the dents, first, a conductor layer is deposited to form an underlying layer for the lower electrodes, an insulating film is deposited thereon, and contact holes are opened on the underlying layer only. Then, a conductor layer is deposited to form an upper layer, and is delineated together with the insulating layer that exists at an intermediate position as shown in FIG. 10, and only the insulating film sandwiched by the two conductor layers is removed. This enables dents to be formed in the intermediate positions. Thereafter, a capacitor insulating film (10.10) and a plate electrode (10.11) are formed. By employing the CVD method, in this case, even narrow gaps can be filled.

Here, reference numeral (10.1) denotes a single crystalline semiconductor substrate, (10.2) denotes an element isolating film, (10.3) denotes a gate insulating film (10.4) denotes word lines, reference numerals (10.5) and (10.8) denote interlayer insulating films, (10.6) denotes impurity diffusion layers, (10.7) denotes bit lines, (10.9) denotes lower electrodes of storage capacities, (10.10) denotes a capacitor insulating film, and reference numeral (10.11) denotes a plate electrode.

According to the present invention as will be obvious from the foregoing description, fine memory cells required for the DRAM's of the level of 16 mega-bits can be easily fabricated based on the conventional photolithograph method and dry etching method. Compared with the STC cells of the conventional structure, furthermore, the storage capacities are not affected by the delineation of plate electrode; i.e., the storage capacity portions can be arranged most densely. Accordingly, a sufficiently large capacity is obtained even with a very small cell area. According to the third embodiment, furthermore, the capacity can be increased by 20 to 30% which is large enough to cope with soft errors caused by alpha particles and circuit noise.

The second feature of the present invention resides in that since the storage capacity portions are formed on the bit lines, the storage capacities and the plate electrode work as shielding lines for the bit lines. Therefore, the interline capacity of the bit lines decreases and the memory array noise decreases greatly, too. A further great feature resides in that the number of masks for realizing the above-mentioned structure is nearly the same as that of the conventional structure.

As mentioned above, the present invention makes it possible to realize the memory cells satisfying areas and capacities required for the DRAM's of the level of several mega-bits to several tens of mega-bits.

What is claimed is:

1. An improved semiconductor memory device having stacked capacitor cells, the improvement comprising:
    projections of bit lines upon a semiconductor substrate meeting at nearly right angles with word lines that are provided nearly in parallel with each other maintaining a predetermined distance;
    channel forming portions that are major portions of active regions surrounded by element isolating insulating film on a surface of the semiconductor substrate arranged at an angle of nearly 45% with respect to said word lines;
    impurity diffusion regions in contact with lower electrodes of storage capacities in said active regions, arranged to be nearly in parallel with the projections of bit lines, the lower electrodes of said storage capacities extending onto said bit lines; and,
    a plate electrode provided to substantially cover surfaces of said word lines, said bit lines and the lower electrodes of said storage capacities.

2. The semiconductor memory device according to claim 1, wherein the major portions of said active regions are repetitively arranged so as not to be in parallel with major portions of four neighboring active regions.

3. The semiconductor memory device according to claim 1, wherein said word lines and said bit lines are electrically insulated from conductor layers disposed over said word lines and said bit lines in a self-aligned manner owing to the insulating film deposited on the conductor layers and the insulating film covering side walls of the conductor layers that are exposed during delineation.

4. The semiconductor memory device according to claim 1, wherein said bit lines are comprised of a laminated film of silicide and low-resistance polycrystalline silicon containing impurities of a laminated film of a refractory metal nitride and a refractory metal.

5. The semiconductor memory device according to claim 1, wherein contact portions of the semiconductor substrate and the lower electrodes of storage capacities are provided in portions that are covered with neither the word lines nor the bit lines in said active regions.

6. The semiconductor memory device according to claim 1, wherein noise due to coupling capacity among the bit lines is decreased by covering the bit lines with the lower electrodes of said storage capacities and the upper electrode which is the plate electrode, and by electrically shielding the bit lines by said two electrodes.

7. The semiconductor memory device according to claim 1, wherein another conductor layer is inserted between said bit lines and the lower electrodes of said storage capacities, in order to decrease noise caused by coupling capacity between the bit lines and the lower electrodes of the storage capacities.

8. The semiconductor memory device according to claim 1, wherein the lower electrodes of the storage capacities are composed of polycrystalline silicon or a refractory metal.

9. The semiconductor memory device according to claim 5, wherein the capacitor insulating file is a silicon oxide film, a silicon nitride film, a composite film of a silicon oxide film and a silicon nitride film, a refractory metal oxide film, a composite film of a refractory metal oxide film and a silicon oxide film, or a composite film of a refractory metal oxide film and a silicon nitride film.

10. The semiconductor memory device according to claim 1, wherein the lower electrode comprises polycrystalline silicon or a refractory metal.

11. The semiconductor memory device according to claim 1, wherein the capacitor insulating film comprises a film of silicon oxide and silicon nitride, and the plate electrode comprises polycrystalline silicon containing impurities.

12. The semiconductor memory device according to claim 1, wherein the capacitor insulating film comprises a multi-layer having an insulating film with a high dielectric constant represented by $Ta_2O_5$, and the plate electrode comprises a refractory metal.

13. The semiconductor memory device according to claim 1, wherein dents are formed in said surface of said lower electrodes for storage capacity.

14. A semiconductor memory device comprising:
a plurality of word lines;
a plurality of bit lines crossing said word lines and extending in a bit line direction; and,
a plurality of memory cells disposed at predetermined positions at which said word lines and said bit lines cross, the memory cells comprising:
a first impurity region formed in a semiconductor substrate;
a second impurity region, common to two neighboring memory cells, formed in said semiconductor substrate and connecting electrically to a bit line;
a lower electrode of storage capacity formed on a bit line and a word line through insulating film, connected electrically to said first impurity region;
a capacitor insulating film disposed on said lower electrode of storage capacity;
a plate electrode disposed on said capacitor insulating film; and,
a bit line contact hole portion, connected electrically to said second impurity region, formed between contact hole portions of said two neighboring memory cells, the contact hold portions being formed at positions where said first impurity region and said lower electrode of storage capacity contact each other, and the contact hole portions of said two neighboring memory cells being arranged such that a line drawn connecting the contact hole portion is non-parallel with the bit line direction.

15. The semiconductor memory device according to claim 14, further comprising major portions of active regions repetitively arranged so as not to be in parallel with major portions of four neighboring active regions.

16. The semiconductor memory device according to claim 14, wherein said word lines and said bit lines are electrically insulated from conductor layers disposed over said word lines and said bit lines in a self-aligned manner owing to the insulating film deposited on the conductor layers and the insulating film covering side walls of the conductor layers that are exposed during delineation.

17. The semiconductor memory device according to claim 14 wherein said bit lines are comprised of a laminated film of silicide and low resistance polycrystalline silicon containing impurities or a laminated film of a refractory metal nitride and a refractory metal.

18. The semiconductor memory device according to claim 14, wherein contact portions of the semiconductor substrate and the lower electrodes of storage capacities are provided in portions that are covered with neither the word lines nor the bit lines in said active regions.

19. The semiconductor memory device according to claim 14, wherein noise due to coupling capacitance between the bit lines is decreased by covering the bit lines with the lower electrodes of said storage capacities and the upper electrode which is the plate electrode, thereby electrically shielding the bit lines.

20. The semiconductor memory device according to claim 14, wherein a conductor layer is inserted between said bit lines and the lower electrodes of storage capacity to decrease noise caused by coupling capacitance between the bit lines and the lower electrodes of storage capacity.

21. The semiconductor memory device according to claim 14, wherein the lower electrodes of the storage capacity are composed of polycrystalline silicon or a refractory metal.

22. The semiconductor memory device according to claim 14, wherein the capacitor insulating film is a silicon oxide film, a silicon nitride film, a composite film of a silicon oxide film and a silicon nitride film, a refractory metal oxide film, a composite film of a refractory metal oxide film and a silicon oxide film, or a composite film of a refractory metal oxide film and a silicon nitride film.

23. The semiconductor memory device according to claim 14, wherein the lower electrode of storage capacity comprises a polycrystalline silicon or a refractory metal.

24. The semiconductor memory device according to claim 14, wherein the capacitor insulating film comprises a film of silicon oxide and silicon nitride, and the plate electrode comprises polycrystalline silicon containing impurities.

25. The semiconductor memory device according to claim 14, wherein the capacitor insulating film comprises a multi-layer film having an insulating film with a high dielectric constant represented by $Ta_2O_5$, and the plate electrode comprises a refractory metal.

26. The semiconductor memory device according to claim 14 wherein dents are formed in side surfaces of said lower electrodes of storage capacity.

* * * * *